United States Patent [19]

Geissler et al.

[11] Patent Number: 4,956,264
[45] Date of Patent: Sep. 11, 1990

[54] RADIATION-POLYMERIZABLE MIXTURE

[75] Inventors: Ulrich Geissler, Hochheim/Main; Hartmut Steppan, Wiesbaden; Walter Herwig, Bad Soden Am Iaunus, all of Fed. Rep. of Germany

[73] Assignee: Hoechst Aktiengesellschaft, Frankfurt am Main, Fed. Rep. of Germany

[21] Appl. No.: 820,782

[22] Filed: Jan. 22, 1986

[30] Foreign Application Priority Data

Nov. 15, 1985 [DE] Fed. Rep. of Germany ....... 3540480

[51] Int. Cl.$^5$ .............................................. G03C 1/16
[52] U.S. Cl. .................................................... 430/281
[58] Field of Search ...................... 430/281, 283, 910; 432/90

[56] References Cited

U.S. PATENT DOCUMENTS

| | | | |
|---|---|---|---|
| 3,783,151 | 1/1974 | Carlick et al. | 260/471 C |
| 3,804,631 | 4/1974 | Faust | 96/115 |
| 3,850,770 | 11/1974 | Juna et al. | 204/159.19 |
| 3,887,450 | 6/1975 | Gilano et al. | 204/159.15 |
| 3,930,865 | 1/1976 | Faust et al. | 96/86 P |
| 3,953,309 | 4/1976 | Gilano et al. | 204/159.16 |
| 3,957,561 | 5/1976 | Skoultchi | 156/331 |
| 4,019,972 | 4/1977 | Faust | 204/159.15 |
| 4,088,498 | 5/1978 | Faust | 96/115 P |
| 4,111,769 | 9/1978 | Stueben | 204/159.15 |
| 4,227,980 | 10/1980 | Pregitzer et al. | 204/159.23 |
| 4,250,248 | 2/1981 | Faust | 430/284 |
| 4,296,196 | 10/1981 | Faust | 430/271 |
| 4,387,139 | 6/1983 | Herwig et al. | 428/423.7 |
| 4,424,100 | 1/1984 | McCarty et al. | 204/159.15 |
| 4,439,600 | 3/1984 | Moran, Jr. | 528/392 |
| 4,458,007 | 7/1984 | Geissler et al. | 430/284 |

FOREIGN PATENT DOCUMENTS 0037314 10/1981 European Pat. Off. .
0128014 12/1984 European Pat. Off. .
0036813 9/1981 Fed. Rep. of Germany .
3441787 9/1985 Fed. Rep. of Germany .

*Primary Examiner*—Jack P. Brammer
*Attorney, Agent, or Firm*—Foley & Lardner, Schwartz, Jeffery, Schwaab, Mack, Blumenthal & Evans

[57] ABSTRACT

A radiation-polymerizable mixture, recording material and process for using the recording material in relief recordings. The radiation-polymerizable mixture contains:

(a) a polymeric binder,
(b) a compound of the formula:

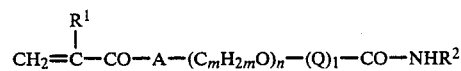

'in which
A is O, NH or N-alkyl,
Q is —CO—$C_pH_{2p}$-Z— or —$C_kH_{2k}$O—,
Z is O or NH,
$R^1$ is H or alkyl,
$R^2$ is alkyl, alkenyl, cycloalkyl, aryl, aralkyl or $SO_2R^3$,
$R^3$ is alkyl, alkenyl, cycloalkyl, aryl, aralkyl or aryloxy,
k is a number from 3 to 20,
l is a number from 0 to 20,
m is a number from 2 to 20,
n is a number from 1 to 20 and
p is a number from 2 to 10, and
(c) a compound or a combination of compounds, which is capable of initiating the polymerization of the compound (b) under the action of actinic radiation.

The mixture is especially suitable for the preparation of dry photoresist materials and is distinguished by good flexibility and adhesion to copper and by easy strippability in the light-cured state.

18 Claims, No Drawings

RADIATION-POLYMERIZABLE MIXTURE

BACKGROUND OF THE INVENTION

The invention relates to a radiation-polymerizable mixture which contains as the essential constituents:
(a) a polymeric binder,
(b) an acrylic or alkacrylic acid derivative polymerizable by free radicals and having a boiling point above 100° C. under normal pressure and
(c) a compound or a combination of compounds, which is capable of initiating the polymerization of the compound (b) under the action of actinic radiation.

The mixture is suitable in particular for the preparation of photoresists, especially those which can be prepared and processed by the dry resist process.

Mixtures of the above-mentioned type are known. In U.S. Pats. No. 3,887,450 and No. 3,953,309, photopolymerizable mixtures for use in the dry resist process are described, which can be developed with aqueous-alkaline solutions and, as the polymerizable compounds, preferably contain exclusively those having two or more polymerizable ethylenically unsaturated groups.

Similar mixtures are known from European Patent Application No. 128,014, which additionally contain a mono-unsaturated polymerizable compound, especially an aryloxypolyalkoxyalkyl (meth)acrylate. This addition is intended to improve the flexibility, tackiness and developability of the layers; stripping of the exposed layer areas is thus also facilitated.

German Offenlegungsschrift No. 3,441,787 has disclosed mixtures of the same type and applicability, which contain mono-unsaturated or polyunsaturated monomers, of which at least one contains an aromatic OH, SH or sulfonamide group. These mixtures are distinguished in particular by ready strippability after exposure.

In dry photoresist layers, it is generally customary to use monomers which contain urethane groups. Mixtures of this type are described, for example, in U.S. Pats. No. 3,850,770, No. 4,019,972, No. 4,088,498, No. 4,250,248 and No. 4,387,139. In all these cases, the mixtures contain polyunsaturated compounds, in most cases di-unsaturated compounds.

U.S. Pat. No. 3,783,151 has disclosed similar mixtures based on polyunsaturated polymerizable compounds which contain urethane groups and which are used for the preparation of radiation-curable surface coatings and printing inks. The urethane groups can be introduced by reaction with monovalent or polyvalent isocyanates. If monovalent isocyanates are employed, they are always reacted with polyunsaturated monomers, for example with pentaerythritol triacrylate.

The dry photoresist materials described above and containing monofunctional unsaturated compounds admittedly have improved flexibility and strippability in the exposed state. However, they have other disadvantages which restrict their usefulness in practice. Thus some of the monomers tend to crystallize, and in other cases the exposed layers are unduly brittle or have inadequate adhesion to copper in the unexposed state.

DISCLOSURE OF THE INVENTION

It is therefore an object of the invention to provide a radiation-polymerizable mixture which has good flexibility, developability and strippability after exposure.

It is another object of the invention to provide a mixture, as above, which has reduced brittleness and improved adhesion to copper compared to known radiation polymerizable mixtures.

It is yet another object of the invention to provide a radiation-polymerizable recording material incorporating the above mixture.

Still another object of the invention is to provide a process for the preparation of relief recordings using the recording material.

According to the invention, a radiation-polymerizable mixture is proposed which contains as the essential constituents:
(a) a polymeric binder,
(b) an acrylic or alkacrylic acid derivative polymerizable by free radicals and having a boiling point above about 100° C. under normal (atmospheric) pressure, and
(c) a compound or a combination of compounds, which is capable of initiating the polymerization of the compound (b) under the action of actinic radiation.

In the mixture according to the invention, the acrylic or alkacrylic acid derivative is a compound of the formula I

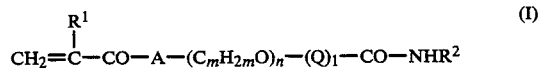

in which
A is O, NH or N-alkyl,
Q is $-CO-C_pH_{2p}-Z-$ or $-C_kH_{2k}O-$,
Z is O or NH,
$R^1$ is H or alkyl,
$R^2$ is alkyl, alkenyl, cycloalkyl, aryl, aralkyl or $SO_2R^3$,
$R^3$ is alkyl, alkenyl, cycloalkyl, aryl, aralkyl or aryloxy,
k is a number from 3 to 20,
l is a number from 0 to 20,
m is a number from 2 to 20,
n is a number from 1 to 20 and
p is a number from 2 to 10.

The invention also encompasses a radiation-polymerizable recording material with a flexible transparent temporary support and a transferable thermoplastic radiation-polymerizable photoresist layer which contains the essential constituents:
(a) a polymeric binder,
(b) acrylic or alkacrylic acid derivative polymerizable by free radicals and having a boiling point above 100° C. under normal pressure, and
(c) a compound or a combination of compounds, which is capable of initiating the polymerization of the compound (b) under the action of actinic radiation, and, if appropriate, a cover sheet, which can be peeled off, on the free side of the photoresist layer and which adheres less strongly to the layer than the temporary support.

In the recording material according to the invention, the acrylic or alkacrylic acid derivative is a compound of the formula I

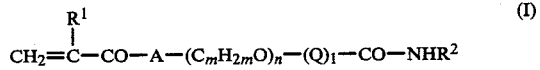

in which

A is O, NH or N-alkyl,
Q is —CO—$C_pH_{2p}$—Z— or —$C_kH_{2k}O$—,
Z is O or NH,
$R^1$ is H or alkyl,
$R^2$ is alkyl, alkenyl, cycloalkyl, aryl, aralkyl or $SO_2R^3$,
$R^3$ is alkyl, alkenyl, cycloalkyl, aryl, aralkyl or aryloxy,
k is a number from 3 to 20,
l is a number from 0 to 20,
m is a number from 2 to 20,
n is a number from 1 to 20 and
p is a number from 2 to 10.

The invention also proposes a process for the production of relief recordings, wherein a dry, solid, radiation-polymerizable photoresist layer contains as the essential constituents:

(a) a polymeric binder, 1 (b) an acrylic or alkacrylic acid derivative polymerizable by free radicals and having a boiling point above 100° C. under normal pressure, and (c) a compound or a combination of compounds, which is capable of initiating the polymerization of the compound (b) under the action of actinic radiation.

The photoresist layer is attached to a flexible transparent temporary support, laminated under pressure and with heating to a final support and is irradiated imagewise. The temporary support is peeled off, and the unirradiated layer areas are washed out with a developer.

In the process according to the invention, the photoresist layer contains, as the acrylic or alkacrylic acid derivative which can be polymerized by free radicals, a compound of the formula I

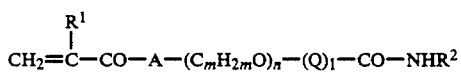

(I)

in which

A is O, NH or N-alkyl,
Q is —CO—$C_pH_{2p}$—Z— or —$C_kH_{2k}O$—,
Z is O or NH,
$R^1$ is H or alkyl,
$R^2$ is alkyl, alkenyl, cycloalkyl, aryl, aralkyl or $SO_2R^3$,
$R^3$ is alkyl, alkenyl, cycloalkyl, aryl, aralkyl or aryloxy,
k is a number from 3 to 20,
l is a number from 0 to 20,
m is a number from 2 to 20,
n is a number from 1 to 20 and
p is a number from 2 to 10.

DETAILED DESCRIPTION OF THE PREFERRED EMBODIMENTS

Monofunctional polymerizable compounds, including also those of the above formula I, are known per se and are described as constituents of photocurable coating compositions, surface coatings or adhesives, for example in U.S. Pats. No. 3,957,561, No. 4,111,769, No. 4,227,980, No. 4,424,100 and No. 4,439,600 and in European Patent Applications No. 36,813 and No. 37,314. Among these known compounds, those of the formula I corresponding to the definition given above are suitable for use in the mixture according to the invention.

In the general formula I, $R^1$ is preferably a hydrogen atom or a methyl group.

$R^2$ preferably has at least 4 carbon atoms. If $R^2$ is an alkyl or alkenyl radical, this radical preferably has 4 to 12 carbon atoms in a straight chain. Preferred cycloalkyl radicals are those which have 5 or 6 ring members and which can be unsubstituted or substituted by alkyl or alkoxy groups having 1 to 3 carbon atoms. The aryl radicals employed are in particular substituted or unsubstituted phenyl radicals. Possible substituents are preferably alkyl, alkoxy or alkylenedioxy groups having 1 to 4 carbon atoms.

$R^3$ is preferably an alkyl, aryl or aryloxy radical, in particular an alkyl radical having 2 to 8 carbon atoms or a mononuclear aryl or aryloxy radical having 6 to 10 carbon atoms.

If A is an N-alkyl group, this preferably has 1 to 6 carbon atoms.

Particularly preferably, A and Z are oxygen atoms.

Preferably, k is a number from 3 to 10, in particular from 3 to 6; l is preferably 0 to 10; m is preferably 2 to 10, in particular 2 to 4; n is preferably 1 to 15, particularly preferably 1 to 10; and p is preferably 3 to 6.

The preferred monofunctional monomers should be virtually non-volatile under the preparation and storage conditions for the mixture and not crystallize during storage of the mixture.

Examples of suitable monomers are the reaction products of isocyanates with hydroxyethyl acrylate or methacrylate or with the reaction products obtained by reaction of hydroxyethyl (meth)acrylate with alkylene oxides or lactams or lactones of aminocarboxylic or hydroxycarboxylic acids, for example caprolactam or caprolactone.

The reaction product of hydroxyethyl methacrylate with tert.-butyl isocyanate is less preferable, since it tends to volatility in most mixtures.

The reaction products of hydroxyethyl methacrylate with halogenated phenyl isocyanates, such as 4-chloro- or 3-chloro-4-methyl-phenyl isocyanate, or with naphthyl isocyanates are also not preferable because of their tendency to crystallize.

In addition to the monofunctional monomers, the mixtures according to the invention can contain polymerizable compounds with at least two terminal ethylenic double bonds. In general, esters of acrylic or methacrylic acid with polyhydric, preferably primary, alcohols are used as the polyfunctional compounds of this type. Examples of suitable polyhydric alcohols are ethylene glycol, propylene glycol, butane-1,4-diol, butane-1,3-diol, diethylene glycol, triethylene glycol, polyethylene glycols or polypropylene glycols with molecular weights from about 200 to 1,000, neopentyl glycol, trimethylolethane, trimethylolpropane, pentaerythritol and oxyethylated bisphenol A derivatives. Bis-acrylates and bis-methacrylates which contain urethane groups and which are obtained by the reaction of diisocyanates with partial esters of polyhydric alcohols and, if appropriate, diols or polyols are also suitable. Such monomers containing urethane groups are described in German Offenlegungsschriften No. 2,064,079, No. 2,361,041 and No. 2,822,190. Similar monomers have been disclosed in German Offenlegungsschrift No. 3,048,502.

The total quantity of polymerizable compounds in the mixture according to the invention is in general 25 to 75 and preferably 40 to 60% by weight, relative to the non-volatile constituents of the mixture. The proportion of monofunctional monomers is in general 5 to 100, preferably 20 to 95 and particularly preferably 55-95% by weight, relative to the total quantity of polymerizable compounds.

A large variety of substances can be used as the polymerization initiators, which can be activated by radiation, in particular actinic light, in the mixture according to the invention. Examples are benzoin and its derivatives, trichloromethyl-s-triazines, heterocyclic compounds with carbonylmethylene groups containing trihalogenomethyl groups, for example 2-(p-trichloromethyl-benzoylmethylene)-3-ethyl-benzo-thiazoline, acridine derivatives, for example, 9-phenyl-acridine, 9-p-methoxyphenyl-acridine, 9-acetyl-aminoacridi and benzo(a)acridine, phenazine derivatives, for example 9,10-dimethyl-benzo(a)phenazine and 10-methoxybenzo(a)phenazine, quinoxaline derivatives, for example 6,4',4''-trimethoxy-2,3-diphenylquinoxaline and 4',4''-dimethoxy-2,3-diphenyl-5-azaquinoxaline, or quinazoline derivatives. The initiators are generally employed in a quantity from 0.01 to 10 and preferably from 0.05 to 4% by weight, relative to the non-volatile constituents of the mixture.

A wide variety of soluble organic polymers can be employed as the binders. Examples which may be mentioned are polyamides, polyvinyl esters, polyvinyl acetals, polyvinyl ethers, epoxide resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers forming the homopolymers enumerated.

Natural substances or modified natural substances, for example gelatine and cellulose ethers, can also be used as the binders.

With particular advantage, binders are used which are water-insoluble but soluble or at least swellable in aqueous-alkaline solutions, since layers with such binders can be developed with the preferred aqueous-alkaline developers. Binders of this type can, for example, contain the following groups: —COOH, —PO$_3$H$_2$, —SO$_3$H, —SO$_2$NH—, —SO$_2$—NH—SO$_2$— and —SO$_2$—NH—CO—.

The following may be mentioned as examples of these: maleate resins, polymers of β-(methacryloyloxy)-ethyl N-(p-tolyl-sulfonyl)-carbamate and copolymers of these and similar monomers with other monomers, as well as styrene/maleic anhydride copolymers. Alkyl methacrylate/methacrylic acid copolymers and copolymers of methacrylic acid, alkyl methacrylates and methyl methacrylate and/or styrene, acrylonitrile and others, such as described in German Offenlegungsschrift No. 2,064,080 and No. 2,363,806, are preferred. More specifically, the former German patent document discloses binders, preferred in the present invention, that are copolymers of methacrylic acid and at least one alkyl methacrylate, with molecular wieght generally ranging from 20,000 to 200,000, wherein the alkyl group with 4 to 15 carbon atoms. One such copolymer is a terpolymer from (a) methacrylic acid, (b) methyl methacrylate or ethyl methacrylate and (c) an alkyl methacrylate with 4 to 15 carbon atoms in the alkyl group. Suitable copolymers can also be prepared only from methacrylic acid and a higher alkyl acrylate, but in this case the alkyl group generally should not contain more than eight carbon atoms.

German Offenlegungsschrift No. 2,363,806 discloses copolymeric binders, likewise preferred in the present invention, that are comprised of:

(A) an unsaturated carboxylic acid,
(B) an alkyl methacrylate with at least 4 carbon atoms in the alkyl group, and
(C) an additional monomer which is capable of copolymerization with monomers (A) and (B) and which has a corresponding homopolymer characterized by a glass transition temperature of at least 80° C., preferable at least 100° C.

Suitable components (c) of the terpolymer include styrene or substituted styrene, e.g., vinyl toluene, p-chlorostyrene, α-chlorostyrene, α-methylstyrene, vinly ethyl benzene, o-methoxystyrene, or m-bromostyrene; vinyl napthalene and substituted vinly naphthalene; heterocyclic vinyl compounds, e.g., N-vinlyl carbazole, vinyl pyridine, or vinyl oxazole; vinyl cycloalkanes, e.g., vinyl cyclohexane and 3,5-dimethyl-vinyl cyclohexane; acrylamide methacrylamide, N-alkylacrylamide, acrylonitrile, methacrylonitrile, aryl methacrylate, aralkyl methacrylate, and others. Preferred terpolymers of this type are those in which component (C) is styrene, p-chloro-styrene, vinyl toluene, vinyl cyclohexane, acrylamide, methacrylamide, N-alkylacrylamide, phenyl methacrylate, acrylonitrile, methacrylonitrile, or benzyl methacrylate, styrene being preferred. Higher-molecular copolymers, such as are described in the earlier German Patent Application P 3,427,519, are particularly preferred. The higher molecular copolymers disclosed in the German application are prepared by mass polymerization and, generally, have mean molecular weights in the range from about 65,000 to 150,000. They are comprised of (i) 20 to 60 mole-% of acrylic acid or methacrylic acid; (ii) 25 to 80 mole-% of an alkyl methacrylate having at least 4 carbon atoms in the alkyl group, a homopolymer of said methacrylate (ii) having a glass transition temperature of not more than 20° C.; and (iii) up to 30 mole-%, preferably between 3 and 20 mole-%, of a monomeric ethylenically unsaturated compound which is copolymerizable with said acid (i) and said methacrylate (ii), a homopolymer of said compound (iii) having a glass transition temperature of at least 80° C.

The quantity of the binder is in general 25 to 75 and preferably 40 to 60% by weight of the constituents of the mixture.

As conventional further constituents, the mixture can contain polymerization inhibitors, hydrogen donors, sensitometric regulators, dyes, pigments, plasticizers, and cross-linking agents which can be activated thermally.

As the actinic radiation, to which the mixture according to the invention is sensitive, any electromagnetic radiation can be employed, the energy of which is sufficient for initiating polymerization. Visible and ultraviolet light, X-rays and electron beams are particularly suitable. Laser radiation in the visible and ultraviolet regions can also be used. Short-wave visible light and near ultraviolet light are preferred.

Suitable supports for the recording materials prepared with the mixture according to the invention are, for example, aluminum, steel, zinc, copper, screens or plastic films, for example of polyethylene terephthalate. The support surface can be pretreated chemically or mechanically, in order to adjust the adhesion of the layer to the correct level.

The mixture according to the invention is preferably used as a photoresist material which can be transferred dry. For this purpose, it can be applied in a known manner as a prefabricated, transferable dry resist film to the workpiece which is to be processed, for example to printed circuit board base material. To prepare the dry resist material, a solution of the mixture in a solvent is in general applied to a suitable support, for example a polyester film, and dried. The layer thickness of the resist layer can be about 10 to 80 and preferably 20 to 60 /um. The free surface of the layer is preferably covered by a cover film, for example of polyethylene or polypropylene. The finished laminate can be stored as a large roll and cut up to resist rolls of any desired width when required.

The films can be processed in any apparatus customary in the dry resist technology. The cover film is peeled off in a commercially available laminating device and the photoresist layer is laminated onto a copper-clad base material. The plate thus prepared is then exposed through an original and, after the support film has been peeled off, developed in the known manner.

Examples of suitable developers are aqueous, preferably aqueous-alkaline solutions, for example solutions of alkali metal phosphates, carbonates or silicates, to which, if appropriate, small quantities, for example up to 10% by weight, of water-miscible organic solvents or wetting agents can be added. If binders are used which are insoluble in aqueous alkaline solutions, organic solvents, for example trichloroethane, are also used.

The mixtures according to the invention can be employed in the most diverse fields of application. With particular advantage, they are used in the form of a dry resist film for the preparation of resists, i.e., etch resist layers or plating resists, on metallic supports, for example copper.

In this application, the outstanding elasticity and toughness of the photoresist layers prepared from the mixture according to the invention manifest themselves both in the unexposed state and in the exposed state. The photopolymerizable layer laminated to copper is so firmly coherent that the unsupported layer areas covering the holes remain undamaged when the carrier film is severed, and are not carried away with this film. Using layers prepared from the mixture according to the invention, it is possible to bridge holes of 6 mm in diameter and larger,the layer remaining undamage when the film is severed, when the layer is developed and when the bared areas are electroplated and/or etched.

Compared with known dry resist layers having exclusively difunctional or polyfunctional monomers, the layers prepared from the mixtures according to the invention have the advantage of better adhesion to copper, of reduced brittleness in the exposed state and of easier strippability after processing. As compared with known dry resist layers which contain both monofunctional and polyfunctional monomers, they have better adhesion to copper in the exposed and unexposed state and—as compared with some of these known mixtures—a lower tendency to crystallize.

The mixtures according to the invention give layers of high flexibility in the unexposed and exposed states, so that the resist templates produced from them can be readily and reliably corrected or retouched. The layers can be developed in a short time, to leave no residue, and, on stripping in the light-cured state, form smaller blobs or particles. In contrast to most of the known dry resist materials containing monofunctional monomers, it is possible to employ with advantageous results those mixtures according to the invention which exclusively contain monofunctional monomers.

These layers have the advantage that after removal (stripping) in the exposed state they completely dissolve in the stripping solution after some time, i.e., do not leave any undissolved blobs or particles behind. It is therefore also possible to use alkaline stripping solutions of lower concentration, i.e., for example 2% instead of 5% potassium hydroxide solution, with substantially the same effect.

The exposed resist templates also withstand aggressive processing solutions, for example gold baths, and show good resistance to developers.

The mixtures according to the invention form dry resist layers, the shear viscosity of which in the unexposed state is less dependent on atmospheric humidity than that of known comparable dry resist materials.

Apart from the dry resist process, the mixture according to the invention is also suitable for other applications, where flexibility and toughness of the light-sensitive layer are important, as for example for the preparation of photoresist solutions, printing forms, relief images, screen-printing templates and color proofing sheets.

The examples which follow illustrate the preferred embodiments of the mixture according to the invention and their applications. Unless otherwise stated, percentage figures and quantitative ratios are to be understood as weight units. Parts by weight (p.b.w.) and parts by volume (p.b.v.) have the same relationship as grams and $cm^3$.

EXAMPLE 1

The following 5 coating solutions were prepared:

| | |
|---|---|
| 5 p.b.w. | of a terepolymer of methyl methacrylate, n-hexyl methacrylate and methacrylic acid (5:60:35) having a mean molecular weight $M_W = 70,000$, |
| 1.1 p.b.w. | of a diurethane obtained from 2 moles of hydroxyethyl methacrylate and 1 mole of 2,2,4-trimethyl-hexamethylene-diisocyanate, |
| 3.9 p.b.w. | of a further polymerizable compound as indicated below, |
| 0.05 p.b.w. | of 9-phenyl-acridine and |
| 0.01 p.b.w. | of a blue azo dye obtained by coupling 2,4-dinitro-6-chloro-benzenediazonium salt with 2-methoxy-5-acetylamino-N,N-diethylaniline, in |
| 16 p.b.w. | of butanone and |
| 4 p.b.w. | of ethanol. |

The individual further polymerizable compounds used were:
(a) the reaction product of hexapropylene glycol monomethacrylate and phenyl isocyanate,
(b) the reaction product of hexapropylene glycol monomethacrylate and m-tolyl isocyanate,
(c) the reaction product of 1 mole of hydroxyethyl acrylate, 2 moles of caprolactone and 1 mole of n-butyl isocyanate,
(d) the reaction product of diethylene glycol monomethacrylate and butyl isocyanate or
(e) the reaction product of 2 moles of hydroxyethyl methacrylate and 1 mole of 2,2,4-trimethylhexamethylene diisocyanate (comparison).

The solutions were whirler-coated onto biaxially stretched and thermofixed polyethylene terephthalate films of 25 /μm thickness, in such a way that a layer weight of 45 g/m² was obtained in each case after drying at 100° C.

Dry resist films thus prepared were laminated by means of a commercially available laminating device at 115° C. to phenoplast laminate boards clade with 35 /μm thick copper foil and exposed for 4 seconds by means of a 5 kW metal halide lamp at a distance of 110 cm between the lamp and the vacuum copying frame. The original used was a line pattern with line widths and spacings down to 80 /μm.

After exposure, the polyester films were peeled off and the layers were developed for 60 seconds with 1% sodium carbonate solution in a spray development apparatus.

The flexibility of the cured resist layers was tested in accordance with DIN 53,232. Using a combtype cross-cut tool, parallel cuts at 1 mm spacing were scribed through the resist layer in one direction and in a second direction at 90° thereto. A pressure-sensitive adhesive tape was then firmly pressed down on the layer surface in the cut area and peeled off at a defined force and rate. The flexibility and adhesion of the layer, the appearance of the cut edges and the percentage of cut squares detached from the support were then evaluated. Rating was on a scale from Gt 0 to Gt 4, Gt 0 meaning completely clean, undamaged cut edges and 0% detachment, and Gt 4 meaning pronounced splintering of strips along the cut edges and at least 65% detachment of cut squares.

Whereas the resist layers (a) to (d) were flexible (Gt 0), the comparison layer (e) was brittle (Gt 4). The flexibility of the resist is an important property which plays a role, inter alia, in the event of a possible retouching or correction.

In a further test, plates prepared and developed as above were rinsed for 30 seconds with tap water, incipiently etched for 30 seconds in a 15% ammonium peroxidisulfate solution, rinsed again with water, immersed for 30 seconds in 10% sulfuric acid and then electroplated successively in the following electrolyte baths:

1. Sixty minutes in a copper electrolyte bath from Messrs. Schloetter, Geislingen/Steige, of the "Glanzkupferbad" type
   Current density: 2.5 A/dm²
   Metal coating: about 30 /μm
   Temperature: room temperature
2. 15 minutes in a lead/tin bath LA from Messrs. Schloetter, Geislingen/Steige
   Current density: 2 A/dm²
   Metal coating: 15 /μm
   Temperature: room temperature The plates did not show any undercutting or damage whatsoever.

The electroplated plates were stripped in 2% potassium hydroxide solution at 50° C. The following times were required for stripping, the first figure in each case indicating the time in seconds up to the start of stripping and the second figure indicating the time up to the end of stripping:

(a) 45–70 (b) 45–65 (c) 65–100 (d) 50–80 (e) 95–150

It will be seen that the stripping time is substantially shortened by the addition of the monofunctional monomers. At the same time, a reduction in the size of the particles formed is observed. This means that the resist can be removed without problems even from narrow channels between conductor tracks.

EXAMPLE 2

Solutions of the following composition were whirler-coated onto 3 polyester films of the type indicated in Example 1, in such a way that after dying a layer weight of 30 g/m² was obtained in each case:

| | |
|---|---|
| 5 p.b.w. | of the terpolymer indicated in Example 1, |
| x p.b.w. | of the reaction product of 2 moles of hydroxyethyl methacrylate and 1 mole of 2,2,4-trimethyl-hexamethylene diisocyanate, |
| y p.b.w. | of the reaction product of 1 mole of hydroxyethyl acrylate, 2 moles of caprolactone and 1 mole of n-butylisocyanate, |
| 0.05 p.b.w. | of 9-phenyl-acridine, |
| 0.006 p.b.w. | of the blue azo dye from Example 1 and |
| 0.024 p.b.w. | of the green dye 1,4-bis-(4-tert.-butoxy-phenylamino)-5,8-dihydroxy-anthraquinone in |
| 25 p.b.w. | of butanone and |
| 5 p.b.w. | of ethanol. |

The quantitative proportions of the monomers in the individual mixtures were as follows:

(a) $X=2$; $y=3$ (b) $x=1.1$; $y=3.9$ (c) $x=0.5$; $y=4.5$

The materials were processed as in Example 1. In the exposed state, all the resist layers were flexible. For stripping in 2% potassium hydroxide solution at 50° C., the following times (seconds) were required: (a) 45–60 (b) 25–30 (c) 15–20

The dependence of the stripping time on the quantitative proportion of monofunctional monomers is clearly evident.

EXAMPLE 3

Dry resist materials were prepared with coating solutions according to Example 2, containing the following quantities of monomers:

| | |
|---|---|
| x p.b.w. | of the bifunctional monomer indicated in Example 2, |
| y p.b.w. | of the reaction product of hexapropylene glycol monomethacrylate and m-tolyl isocyanate |

(a) $x=2$; $y=3$ (b) $x=1.1$; $y=3.9$ (c) $x=0.5$; $y=4.5$

For stripping in 2% potassium hydroxide solution at 50° C., the following times in seconds were required:
(a) 35–45 (b) 25–30 (c) 15–25

EXAMPLE 4

A coating solution of

| | |
|---|---|
| 5 p.b.w. | of the terpolymer indicated in Example 1, |
| 5 p.b.w. | of the reaction product of 1 mole of hydroxyethylacrylate, 2 moles of caprolactone and 1 mole of n-butyl isocyanate, |
| 0.05 p.b.w. | of 9-phenyl-acridine, |
| 0.006 p.b.w. | of the blue azo dye from Example 1 and |
| 0.024 p.b.w. | of the green dye 1,4-bis-(4-tert.-butoxy-phenylamino)-5,8-dihydroxy-anthraquinone in |

-continued

| | |
|---|---|
| 15 p.b.w. | of butanone and |
| 5 p.b.w. | of ethanol. | was whirler-coated onto the polyester film described in Example 1 in such a way that a layer weight of 30 g/m$^2$ was obtained after drying at 100° C. The layer was laminated to a phenoplast laminate plate clad with a 35 /μm thick copper foil. It was then exposed for 6 seconds with a metal halide lamp through a negative original of a track pattern and, after peeling off the support film, developed for 60 seconds with 1% sodium carbonate solution.

The bared copper surfaces were removed by means of a copper chloride etch solution containing ammonia and the resist was stripped with 5% potassium hydroxide solution at 50° C. A good etching result was obtained. The stripping time was 25 to 55 seconds, and the particles initially formed had dissolved completely in the stripping solution after about 12 hours. The good developer resistance of the resist layer, which exclusively contains a monofunctional monomer as the polymerizable compound, is particularly surprising.

To determine the developer resistance, an exposure for 6 seconds was made through a 13-step exposure wedge with density steps of 0.15 and development with 1% sodium carbonate solution was then carried out until the unexposed areas had been just completely removed ($t_a$). The number of step wedges found was compared with that obtained at three times the developing time ($3 \times t_a$):

| | $t_a$ | $3 \times t_a$ |
|---|---|---|
| step wedges | 8 (9) | 8 |

EXAMPLE 5

Dry resist materials with 38 /μm thick resist layers were prepared by whirler-coating the solutions indicated below onto polyester films and subsequent drying:

| | |
|---|---|
| 5.6 p.b.w. | of the terpolymer indicated in Example 1, |
| 3.1 p.b.w. | of the monomer from Example 4, |
| 1.3 p.b.w. | of one of the polyglycol bismethacrylates indicated below, |
| 0.05 p.b.w. | of 9-phenyl-acridine, |
| 0.006 p.b.w. | of the blue azo dye according to Example 1 and |
| 0.024 p.b.w. | of the green anthraquinone dye according to Example 2 in |
| 15 p.b.w. | of butanone and |
| 5 p.b.w. | of ethanol. |

The bifunctional monomer employed was (a) the bis-methacrylate of a polypropylene glycol of molecular weight 420 and in the other case (b) the corresponding ester of a polyethylene glycol of molecular weight 400. The photoresist layers were processed as described in Example 1. 30–70 seconds in case (a) and 35–60 seconds in case (b) were required for stripping after electroplating.

In a further test series, dry resist materials according to (a) and (b) were laminated to copper-clad test plates with holes of between 1 and 6 mm diameter and exposed through a negative original corresponding to the holes (diameter of the transparent areas 1.4 to 6.4 mm). The unexposed layer areas were then washed out with 1% sodium carbonate solution and the bared copper was etched away with copper chloride solution containing ammonia. After etching, all the holes were bridged by cured photo-resist.

EXAMPLE 6

As described in Example 1c and 5a, dry resist materials were prepared, laminated to copper-clad plates of insulating material, exposed and developed. The structured plates obtained were then electroplated as follows:

(1.) 60 minutes in a copper electrolyte bath from Messrs. Blasberg, Solingen, of Cuprostar LP 1" type Current density: 2.0 A/dm$^2$ Metal coating: about 24 /μm Temperature: room temperature (2.) 15 minutes in a nickel bath of "Norma" type from Messrs. Schloetter, Geislingen/Steige Current density: 3.5 A/cm$^2$ Metal coating: 12 /μm Temperature: 50° C.

(3.) 10 minutes in an "Autronex CC" type gold bath from Messrs. Blasberg, Solingen Current density: 1.0 A/dm$^2$ Metal coating: 3 /μm Temperature: room temperature The plates did not show any undercutting or damage.

EXAMPLE 7

The procedure followed was as in Example 1, but in each case one of the following was employed as the monofunctional polymerizable compound:

(a) the reaction product of hydroxyethyl methacrylate and n-butyl isocyanate, (b) the reaction product of 1 mole of hydroxyethyl methacrylate, 2 moles of caprolactone and 1 mole of n-butyl isocyanate, (c) the reaction product of hexapropylene glycol monomethacrylate and n-butyl isocyanate.

Results similar to those in Example 1 were obtained with the resulting dry resist materials.

EXAMPLE 8

A dry resist material was prepared in accordance with Example 1c. For comparison, another otherwise identical material was prepared which, instead of the monofunctional monomer from Example 1c, contained the same quantity of the reaction product of 1 mole of hydroxyethyl acrylate and 2 moles of caprolactone. The materials were laminated to copper as in Example 1, exposed for 6 seconds and developed. The flexibility and adhesion of the unexposed layers were tested as in Example 1. The developer resistance was also tested as in Example 4.

The table which follows shows the results:

| Resist | Adhesion to Cu | Developer resistance, wedge steps | |
|---|---|---|---|
| | | $t_a$ | $t_a \times 3$ |
| 1 c | Gt 0 | 8 (9) | 8 |
| Comparison | Gt 4 | 6 (7–9) | 4 (5–8) |

Apart from markedly poorer adhesion, the comparison layer is conspicuous by the large number of partially cross-linked steps and by the poorer developer resistance.

EXAMPLE 9

Coating solutions of the following compositions were prepared:

(a)

| | |
|---|---|
| 5 p.b.w. | of the terpolymer indicated in Example 1, |
| 1.1 p.b.w. | of the bifunctional monomer indicated in Example 1, |
| 3.9 p.b.w. | of the reaction product of diethylene glycol monomethacrylate and n-butyl isocyanate, |
| 0.05 p.b.w. | of 9-phenyl-acridine and |
| 0.016 p.b.w. | of the blue azo dye indicated in Example 1 in |
| 16 p.b.w. | of butanone and |
| 4 p.b.w. | of ethanol, |

(b) the same solution as under (a), but wherein the monofunctional monomer was replaced by the samwe quantity of phenoxyethoxyethyl acrylate (comparison), (c) the same solution as under (a), but wherein the monofunctional monomer was replaced by the same quantity of hydroquinone monomethacrylate (comparison), (d) (comparison)

| | |
|---|---|
| 5 p.b.w. | of the terpolymer indicated in Example 1, |
| 5 p.b.w. | of a commercially available solution of 65 p.b.w. of a bisacrylate containing urethane groups in 35 p.b.w. of phenoxyethyl acrylate (Laromer LR 8642x from BASF AG), |
| 0.05 p.b.w. | of 9-phenyl-acridine and |
| 0.016 p.b.w. | of the blue azo dye indicated in Example 1 in |
| 16 p.b.w. | of butanone and |
| 4 p.b.w. | of ethanol, |

(e) (comparison)

| | |
|---|---|
| 40 p.b.w. | of the terpolymer indicated in Example 1, |
| 12 p.b.w. | of trimethylolpropane triacrylate, |
| 10 p.b.w. | of phenoxyethoxyethyl acrylate, |
| 0.312 p.b.w. | of 9-phenyl-acridine and |
| 0.096 p.b.w. | of the blue azo dye indicated in Example 1 in |
| 100 p.b.w. | of butanone and |
| 25 p.b.w. | of ethanol. |

The solutions were whirler-coated onto polyester films of the type indicated in Example 1 and dried; the layer weight was 45 g/m$^2$ in each case. The dry resist material were then laminated in a commercially available laminator at 115° C. to copper-clad plates of insulating material. The adhestion of the unexposed layers was tested by the cross-cut test described in Example 1. The table which follows shows the results.

| | a | b | c | d | e |
|---|---|---|---|---|---|
| Adhesion | Gt 0 | >Gt 4 | >Gt 4 | >Gt 4 | >Gt 4 |

On storage, the monofunctional monomer crystallized out of the layer (c).

EXAMPLE 10

A coating solution consisting of

| | |
|---|---|
| 5 p.b.w. | of the terpolymer indicated in Example 1, |
| 1.5 p.b.w. | of the bismethacrylate indicated in Example 1, |
| 3.5 p.b.w. | of the monofunctional monomer indicated in Example 1c, |
| 0.05 p.b.w. | of 9-phenyl-acridine and |
| 0.01 p.b.w. | of the blue azo dye indicated in Example 1 in |
| 16 p.b.w. | of butanone and |
| 4 p.b.w. | of ethanol | was whirler-coated onto a polyester film as in Example 1 and dried. Two dry resist films prepared as described above were laminated to one another in a laminating apparatus. After a support film had been peeled off, a further resist layer was applied and finally a fourth resist layer was combined with the others by lamination.

In the second test, the procedure followed was as above, but the monofunctional monomer in the coating solution was replaced by the same quantity of the bismethacrylate indicated therein (comparison). A sandwich laminate with a resist layer of four times the thickness was also prepared from this material in the same manner as above.

Samples of the two laminates were each stored at 0% and at 53% relative humidity. The shear viscosity (in MPa.s) at 40° C. was then measured on these samples. The ratio of the shear viscosities at 0%/53% relative humidity was 1.7 for the material according to the invention; in the comparison test, the corresponding ratio was 4.5. The test shows that the dependence of the shear viscosity of the unexposed resist layer, which is a measure of the cold flow of the layer, on the atmospheric humidity is substantially smaller in the case of the material according to the invention than in the case of the material without a monofunctional monomer.

What is claimed is:

1. A radiation-polymerizable mixture, consisting essentially of:
    (a) an amount of a polymeric binder selected from the group consisting of (i) a polymeric binder that is water-insoluble and soluble or at least swellable in aqueous-alkaline solutions, (ii) a polyacrylate and (iii) a polymethacrylate, said amount ranging from 25% to 75% by weight, based on the total weight of non-volatile constituents;
    (b) from 25% to 75% by weight, based on the total weight of non-volatile constituents, of polymerizable material, comprising
        (1) up to 95% by weight, based on the weight of polymerizable material, of a compound that is polymerizable by free radicals, that has a boiling point above 100° C. at atmospheric pressure, and that contains at least two ethylenically unsaturated polymerizable groups and
        (2) from 5% to 100% by weight, based on the weight of polymerizable material, of an acrylic or alkacrylic acid derivative that is polymerizable by free radicals and that has a boiling point above about 100° C. at atmospheric pressure,
    wherein the weight-percentages in (a) and (b) are based, respectively, on the total weight of non-volatile constituents; and
    (c) from 0.01 to 10% by weight, based on the total weight of non-volatile constituents, of at least one initiator compound capable of initiating the polymerization of said acid derivative under the action of actinic radiation, wherein said acid derivative is represented by the formula:

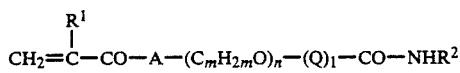

wherein
A is O, NH, or N-alkyl,
Q is —CO—$C_pH_{2p}$—Z— or —$C_kH_{2k}O$—,
Z is O or NH,
$R^1$ is H or alkyl,
$R^2$ is alkyl, alkenyl, cycloalkyl, aryl, aralkyl or $SOT_2R^3$,
$R^3$ is alkyl, alkenyl, cycloalkyl, aryl aralkyl or aryloxy,
k is a number from 3 to 20,
l is a number from 0 to 20,
m is a number from 2 to 20
n is a number from 1 to 20, and
p is a number from 2 to 10.

2. A radiation-polymerizable mixture as claimed in claim 1, wherein said polymerizable compound having at least two polymerizable groups is selected from the group consisting of esters of a polyhydric alcohol and acrylic acid, and esters of a polyhydric alcohol and methacrylic acid.

3. A radiation-polymerizable mixture as claimed in claim 1, wherein said mixture contains from about 25 to about 75% by weight of the sum of said acid derivative and said polymerizable compound having at least two polymerizable groups.

4. A radiation-polymerizable mixture as claimed in claim 1, wherein said mixture contains from about 40 to about 60% by weight polymeric binder, from about 40 to about 60% by weight of the sum of said acid derivative and said polymerizable compound having at least two polymerizable groups, and from about 0.05 to about 4% by weight of said at least one initiator, relative to the total quantity of non-volatile constituents.

5. A radiation-polymerizable mixture as claimed in claim 1, wherein A and Z are oxygen atoms.

6. A radiation-polymerizable mixture as claimed in claim 1, wherein l=0 to 10 and p=3 to 6.

7. A radiation-polymerizable mixture as claimed in claim 1, wherein k=3 to 6, m=2 to 4 and n=1 to 10.

8. A radiation-polymerizable mixture as claimed in claim 1, wherein $R^2$ has at least 4 carbon atoms.

9. A radiation-polymerizable mixture as claimed in claim 1, wherein $R^2$ has from 4 to 12 carbon atoms and is selected from the group consisting of straight chain alkyl and alkenyl radicals.

10. A radiation-polymerizable mixture as claimed in claim 1, wherein $R^3$ is selected from the group consisting of an alkyl radical having from 2 to 8 carbon atoms, a mononuclear aryl radical having from 6 to 10 carbon atoms and an aryloxy radical having from 6 to 10 carbon atoms.

11. A radiation-polymerizable mixture as claimed in claim 1, wherein said mixture is a dry photoresist material.

12. A radiation-polymerizable mixture as claimed in claim 1, wherein said polymeric binder is water-insoluble but soluble or at least swellable in a aqueous-alkaline solution.

13. A radiation-polymerizable mixture as claimed in claim 12, wherein said polymeric binder is selected from the group consisting of a maleate resin, a styrene/maleic anhydride copolymer, a homopolymer or copolymer of β-(methacryloyloxy)-ethyl N-(p-tolyl-sulfonyl)-carbamate, and an alkyl methacrylate/methacrylic acid copolymer.

14. A radiation-polymerizable mixture as claimed in claim 1, wherein said polymeric binder is a copolymer of methacrylic acid and an alkyl methacrylate, said copolymer having an alkyl group of 4 to 15 carbon atoms.

15. A radiation-polymerizable mixture as claimed in claim 14, wherein said polymeric binder has a molecular weight between about 20,000 and 200,000.

16. A radiation-polymerizable mixture as claimed in claim 1, wherein said polymeric binder is a copolymer of
(A) an unsaturated carboxylic acid,
(b) an alkyl methacrylate with at least 4 carbon atoms in the alkyl group, and
(C) an additional monomer which is capable of copolymerization with monomers (A) and (B) and whose corresponding homopolymer has a glass transition temperature of at leat 80° C.

17. A radiation-polymerizable mixture as claimed in claim 1, wherein said polymeric binder is a copolymer comprising (A) 20 to 60 mole-% of acrylic acid or methacrylic acid; (b) 25 to 80 mole-% of an alkyl methacrylate having at least 4 carbon atoms in the alkyl group, a homopolymer of said methacrylate (b) having a glass transition temperature of not more than 20° C.; and (C) up to 30 mole-% of a monomeric ethylenically unsaturated compound which is copolymerizable with said acid (A) and said methacrylate (B), a homopolymer of said compound (C) having a glass transition temperature of at least 80° C., wherein said copolymer has a mean molecular weight in the range from about 65,000 to 150,000 and is prepared by mass polymerization.

18. A radiation-polymerizable mixture as claimed in claim 17, wherein compound (c) is present in an amount ranging between 3 and 20 mole-%.

* * * * *

UNITED STATES PATENT AND TRADEMARK OFFICE
CERTIFICATE OF CORRECTION

PATENT NO. : 4,956,264

DATED : September 11, 1990

INVENTOR(S) : Ulrich Geissler et al

It is certified that error appears in the above-identified patent and that said Letters Patent is hereby corrected as shown below:

Claim 1, (Column 15), line 16, change "$SOT_2R^3$" to --$SO_2R^3$--.

Column 15, line 17, insert a comma (,) between "aryl" and "aralkyl".

Column 16, lines 32, 42 and 44, change "(b)" to -- (B) --.

Column 16, line 54, change "(c)" to -- (C) --.

Signed and Sealed this

Twenty-seventh Day of October, 1992

*Attest:*

DOUGLAS B. COMER

*Attesting Officer*  *Acting Commissioner of Patents and Trademarks*